United States Patent [19]
Inoh

[11] Patent Number: 5,866,446
[45] Date of Patent: Feb. 2, 1999

[54] METHOD OF MANUFACTURING BIMOS DEVICE

[75] Inventor: Kazumi Inoh, Yokohama, Japan

[73] Assignee: Kabushiki Kaisha Toshiba, Kawasaki, Japan

[21] Appl. No.: 816,037

[22] Filed: Mar. 11, 1997

[30] Foreign Application Priority Data

Mar. 15, 1996 [JP] Japan ................................. 8-059213
Feb. 6, 1997 [JP] Japan ................................. 9-023675

[51] Int. Cl.⁶ .............................................. H01L 21/8238
[52] U.S. Cl. ........................... 438/202; 438/234; 438/231;
438/300; 438/301; 438/363; 438/373; 438/374;
438/526; 438/549; 148/DIG. 9
[58] Field of Search ................................. 438/202, 234,
438/229, 231, 299, 300, 301, 363, 373,
374, 526, 549, 219, 313; 148/DIG. 9

[56] References Cited

U.S. PATENT DOCUMENTS

| | | | |
|---|---|---|---|
| 4,180,827 | 12/1979 | Gates | 357/44 |
| 4,902,640 | 2/1990 | Sachitano et al. | 437/57 |
| 4,960,726 | 10/1990 | Lechaton et al. | 437/59 |
| 5,100,811 | 3/1992 | Winnerl et al. | 437/31 |
| 5,288,652 | 2/1994 | Wang et al. | 437/31 |
| 5,439,833 | 8/1995 | Hebert et al. | 437/31 |

FOREIGN PATENT DOCUMENTS 402284459 11/1990 Japan ................................. 438/219
403160754 7/1991 Japan ................................. 438/219

OTHER PUBLICATIONS

Nagata et al., "Tho-Kohsoku Bipolar Device", Standard Handbook for Bipolar Transistor Engineers, Chap. 4, Sec. 4.2, (1985), pp. 87–88.

Primary Examiner—John Niebling
Assistant Examiner—Long Pham
Attorney, Agent, or Firm—Foley & Lardner

[57] ABSTRACT

To enable a high speed operation and to increase the current gain, the disclosed a method of manufacturing a semiconductor device, comprising the steps of: forming a first semiconductor layer with a first-conductivity type in a semiconductor substrate; forming a second semiconductor layer with a second-conductivity type different from the first-conductivity type on the first semiconductor layer; insulation separating the formed second semiconductor layer into a first semiconductor region and a second semiconductor region by an insulating film; changing the second semiconductor region to the first-conductivity type; forming a pattern of an insulating film or a photoresist film having a hole at a partial area of the first semiconductor region of the semiconductor substrate; and implanting first-conductivity type impurities and second-conductivity type impurities at the first semiconductor region, respectively by use of the formed pattern as a mask, to form a first-conductivity type impurity region contacting with the first semiconductor layer and a second-conductivity type impurity region.

18 Claims, 13 Drawing Sheets

METHOD OF MANUFACTURING BIMOS DEVICE

BACKGROUND OF THE INVENTION

1. Field of the Invention

The present invention relates to a method of manufacturing a semiconductor device including a horizontal bipolar transistor.

2. Description of the Prior Art

In general, when a composite device such as IIL (Integrated Injection Logic) is formed, a vertical npn transistor and a lateral pnp transistor, for instance are both manufactured under coexistence condition. In this case, the lateral pnp transistor is formed in accordance with the process of forming the vertical npn transistor.

Figure 4A:
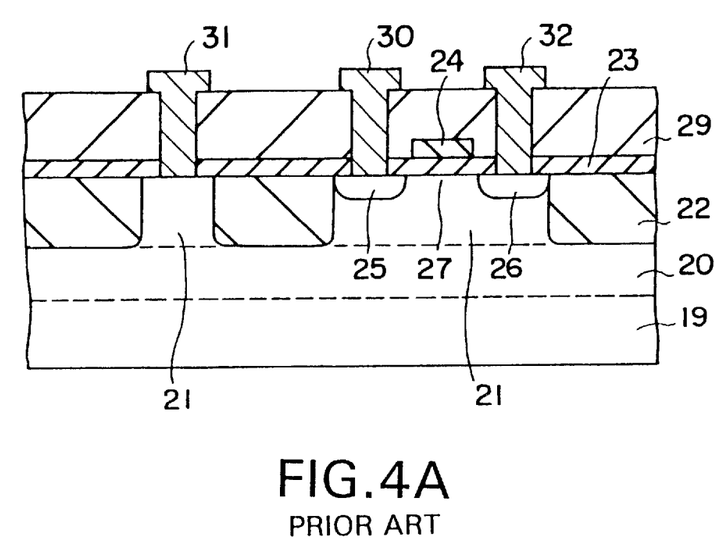
FIG. 4A is a cross-sectional view showing a prior art semiconductor device, taken along the line B–B' in FIG. 4B.
Figure 4B:
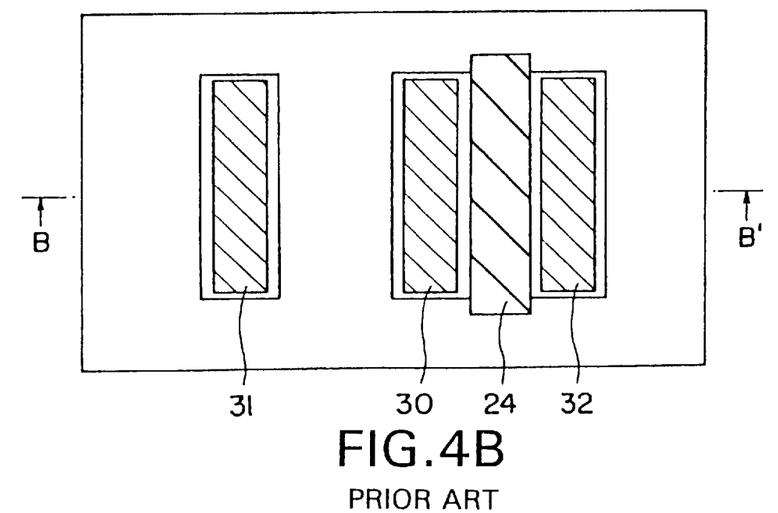
FIG. 4B is a plane view showing the prior art semiconductor device.

FIGS. 4A and 4B show an example of the composite device. In FIGS. 4A and 4B, the lateral pnp transistor is formed as follows: An n-type impurity region of high concentration (e.g., $1 \times 10^{19} cm^{-3}$) is formed in a silicon substrate 19 as an N-type buried layer 20; a collector epitaxial layer 21 is grown on the n-type buried layer 20; and the formed epitaxial layer 21 is insulated and separated by an insulation separating layer 22 formed of an oxide film. Successively, an oxide film 23 and a nitride film 24 are both deposited all over the substrate in sequence. Further, the formed nitride film 24 is patterned to a predetermined shape. After that, an emitter region 25 is formed by implanting B or $BF_2$ ions at a dose of about $1 \times 10^{16} cm^{-2}$. Further, a collector region 26 is formed by implanting B or $BF_2$ ions at a dose of about $1 \times 10^{13} cm^{-2}$. Therefore, as described above, a part of the epitaxial layer 21 can be formed as a base region 27. After that, after an interlayer insulating film 29 has been formed by use of the well-known technique, contact holes are opened; the opened contact holes are buried by a metal film; the metal electrodes are formed to form metal electrodes; and then an emitter electrode 30, a base electrode 31 and a collector electrode 32 are formed to complete a transistor.

In the transistor manufactured as described above, since the width of the base thereof is decided on the basis of the precision of the photolithography, it has been so far limited to use the formed transistor for a high speed circuit. In addition, since the minority carriers injected from the lower surface of the emitter region 25 do not reach the collector region 26, there exists a problem in that the current gain is reduced.

In other words, since the base width of the lateral pnp transistor is decided by the limit of the photolithography, it is difficult to reduce the base width down to about 0.1 μm or less by the present processing technique, so that the formed transistor cannot be operated at a high speed. Further, since the emitter region 25 and the collector region 26 are both formed separately by the different photolithography process, there exists another problem in that the manufacturing cost is relatively high.

Figure 5:
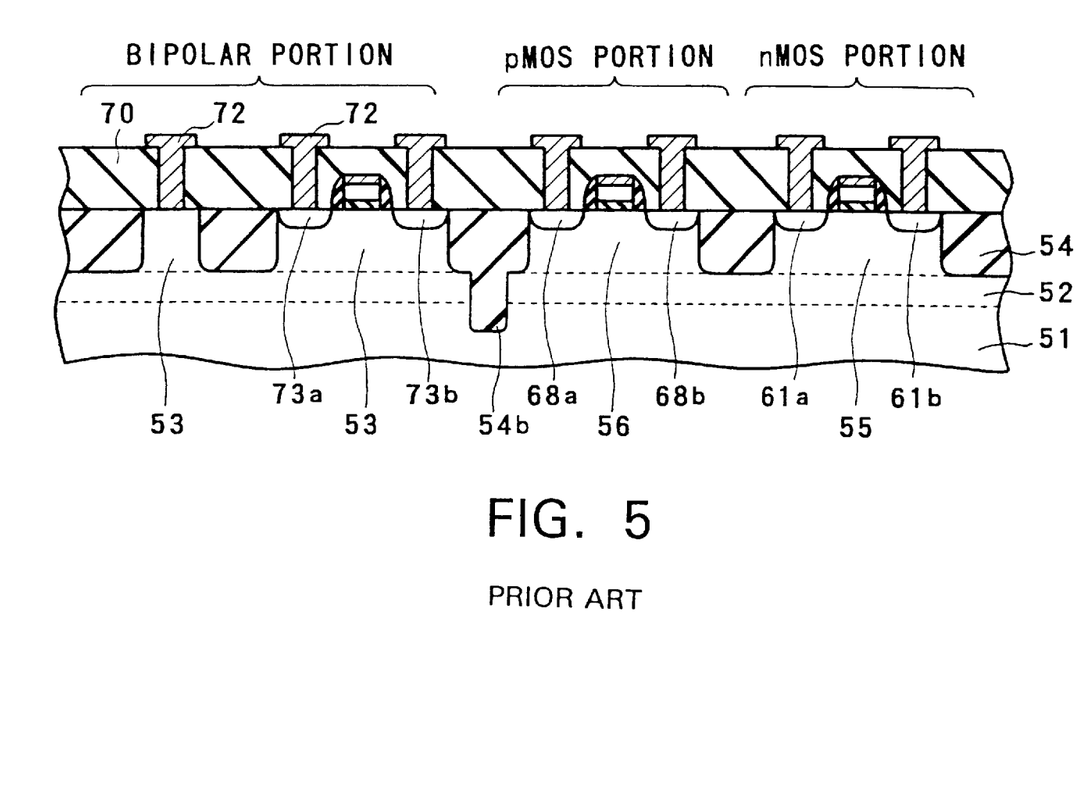
FIG. 5 is a cross-sectional view showing a prior art Bi-CMOS transistor.

Further, FIG. 5 shows an example of prior art Bi-CMOS transistors. In the Bi-CMOS transistors, a bipolar transistor of high operational speed and a CMOS transistor of easy integration are combined with each other in general. In the Bi-CMOS transistor, however, since the manufacturing process is generally complicated, there exists such a shortcoming that the manufacturing cost thereof is relatively high. To overcome this problem, a low-cost Bi-CMOS transistor as shown in FIG. 5 has been proposed, in which a MOS transistor is substituted for a bipolar transistor. In this case, for instance, a base region 53 of a pnp type bipolar portion is formed in the same way as with the case of an N-well 56 of a pMOS transistor, and further an emitter region 73a and a collector region 73b are formed in the same way as with the case of a source region 68a and a drain region 68b of a pMOS transistor, respectively.

In the Bi-CMOS transistor as described above, since the manufacturing process can be simplified, it is possible to reduce the manufacturing cost thereof. In this method, however, since the thickness of the base layer of the bipolar transistor cannot be reduced, there exists a problem in that the high speed operation is not enabled. Further, since the breakdown voltage of the bipolar portion is relatively low, there exists another problem in that the reliability of the element is low. In addition, in the same way as with the case of the prior art lateral bipolar transistor as shown in FIGS. 4A and 4B, a problem arises in that the current gain thereof is also low.

SUMMARY OF THE INVENTION

With these problems in mind, therefore, it is the object of the present invention to provide a method of manufacturing a semiconductor device having a horizontal bipolar transistor, which can be operated at a high speed and has the highest possible current gain.

To achieve the above-mentioned object, the present invention provides a method of manufacturing a semiconductor device, comprising the steps of: forming a first semiconductor layer with a first-conductivity type in a semiconductor substrate; forming a second semiconductor layer with a second-conductivity type different from the first-conductivity type on the first semiconductor layer; insulation separating the formed second semiconductor layer into a first semiconductor region and a second semiconductor region by an insulating film; changing the second semiconductor region to the first-conductivity type; forming a pattern of an insulating film or a photoresist film having a hole at a partial area of the first semiconductor region of the semiconductor substrate; and implanting first-conductivity type impurities and second-conductivity type impurities at the first semiconductor region, respectively by use of the formed pattern as a mask, to form a first-conductivity type impurity region contacting with the first semiconductor layer and a second-conductivity type impurity region.

In the method of manufacturing the semiconductor device according to the present invention, when the first-conductivity type and second-conductivity type impurities are implanted by use of a patterned mask having a hole in a partial area of the first semiconductor region (a collector region), the first-conductivity impurity region (a base region) is formed at the first semiconductor region so as to be in contact with the first-conductivity type semiconductor layer, and further the second-conductivity type impurity region (an emitter region) is formed at the first semiconductor region.

Further, it is preferable that after one-conductivity type impurities have been implanted, the other-conductivity impurities are implanted by controlling the aperture width of the patterned hole and by use of the pattern in which aperture width of the hole has been controlled as a mask.

Further, it is also possible to form the impurity region (the emitter region) in such a way that after the first-conductivity type impurity region (the base region) has been formed by implanting the first-conductivity type impurities, the side wall film is formed on the side wall portion of the hole, and the second-conductivity impurities are implanted by use of the pattern and the side wall film as a mask.

Further, it is also possible to form the first-conductivity impurity region (the base region) in such a way that after the second-conductivity type impurity region (the emitter region) has been formed by implanting the second-conductivity type impurities, the aperture width of the pattern is widened by etching, and the first-conductivity impurities are implanted by use of the pattern having a widened aperture width as a mask.

In the manufacturing method according to the present invention, since the emitter region is formed at the collector region, and further since the base region is formed in the collector region so as to cover the emitter region, it is possible to reduce the base width between the emitter region and the collector region, so that the high speed operation is enabled. Further, since almost all of the minority carriers injected from the emitter region can reach the collector region, it is possible to increase the current gain of the device.

DETAILED DESCRIPTION OF THE PREFERRED EMBODIMENTS (First embodiment)

Figure 1:
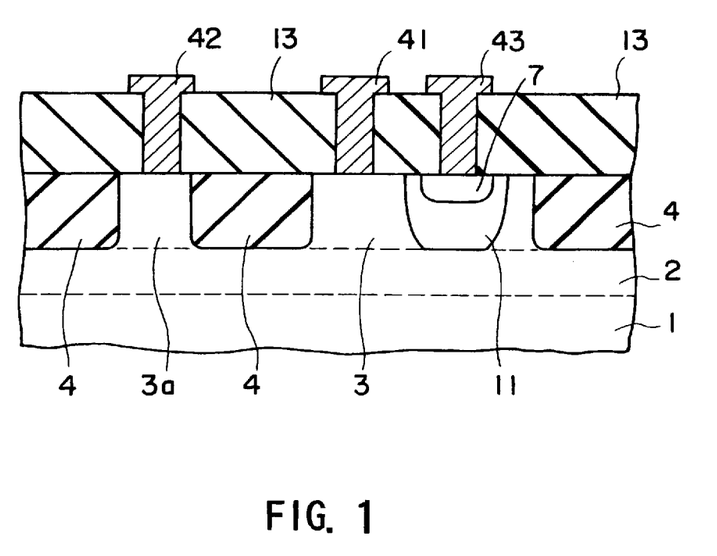
FIG. 1 is a cross-sectional view showing a first embodiment of the semiconductor device according to the present invention.

The first embodiment of the semiconductor device according to the present invention will be described with reference to FIG. 1. In this embodiment, the semiconductor device is a lateral pnp bipolar transistor, in which the major current flows in the horizontal direction.

An n-type impurity layer 2 having an impurity concentration of $1\times10^{19} cm^{-3}$ or higher is formed on a silicon substrate 1. Further, on the impurity layer 2, a p-type epitaxial layer 3 and an n-type epitaxial layer 3a are formed being separated by a separation insulating layer 4. Further, a p-type emitter region 7 is formed in a region near the surface of the p-type epitaxial layer 3. Further, an n-type base region 11 is formed in the p-type epitaxial layer 3 in such a way as to cover the emitter region 7 and reach the n-type buried layer 2. Further, the p-type epitaxial layer 3 is a collector region, and the n-type epitaxial layer 3a is a base leading region.

Further, an interlayer insulating film 13 is formed on the semiconductor substrate 1 on which the collector region 3, the emitter region 7 and the base region 11 have been all formed. In the interlayer insulating film 13, contact holes contacting with the collector region 3, the base leading region 3a, and the emitter region 7 are formed. These contact holes are buried with a metal film and then patterned so as to form a collector electrode 41, a base electrode 42 and an emitter electrode 43, respectively.

(Second embodiment)

The second embodiment of the method of manufacturing the semiconductor device according to the present invention will be described with reference to FIGS. 2A to 2C and FIGS. 3A and 3B.

Figure 2A:
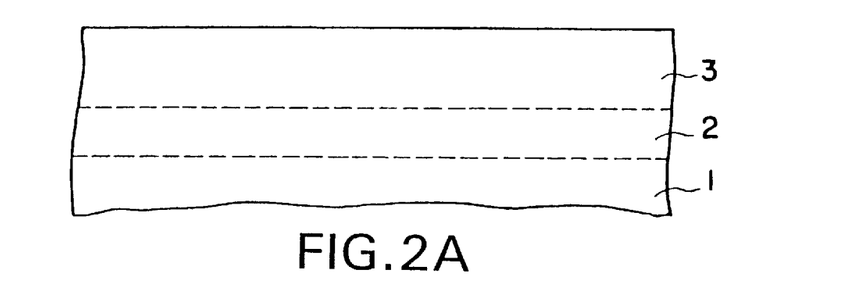
FIGS. 2A, 2B and 2C and FIGS. 3A and 3B are cross-sectional views showing the manufacturing process of a second embodiment of the method of manufacturing the semiconductor device according to the present invention.

As shown in FIG. 2A, after the n-type buried layer 2 with a high concentration (e.g., $1\times10^{19} cm^{-3}$ or higher) has been formed in the silicon substrate 1, the p-type epitaxial layer 3 with a concentration of $1\times10^{15}$ to $1\times10^{17} cm^{-3}$ is formed on the n-type buried layer 2.

Figure 2B:
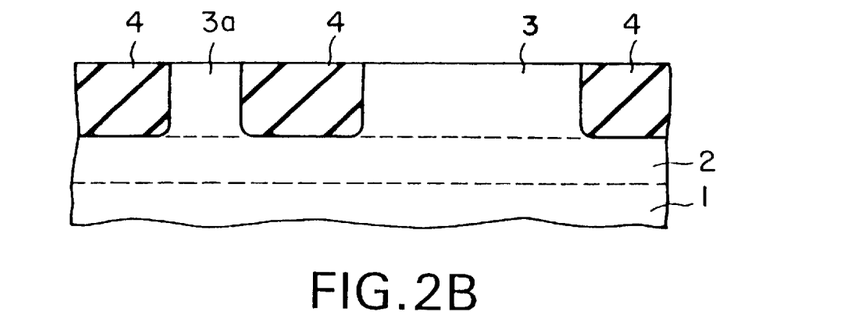

Further, as shown in FIG. 2B, after the p-type epitaxial layer 3 has been patterned to remove the epitaxial layer 3 from regions where element separating regions are to be formed, an insulating film 4 formed of $SiO_2$, for instance is buried at the removed regions. Successively, after a region except a region where a base leading layer is to be formed has been covered with a mask (not shown), n-type impurity ions such as As are implanted, to form the n-type base leading region 3a.

Figure 2C:
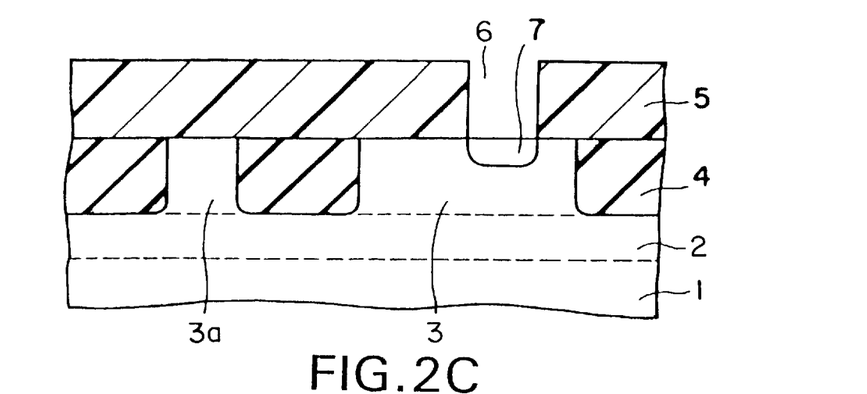

Further, as shown in FIG. 2C, after a photoresist has been applied all over the substrate 1, a resist pattern 5 having a hole 6 is formed in the p-type epitaxial layer 3 at a region where the collector region is to be formed by exposure and development. Further, p-type impurity ions B or $BF_2$ are implanted shallow with the resist pattern 5 as a mask, to form the emitter region 7. In this case, it is possible to increase the impurity concentration at the emitter region 7 than that at the collector region 3, by controlling the dose of the impurities to be implanted to the emitter region 7.

Figure 3A:
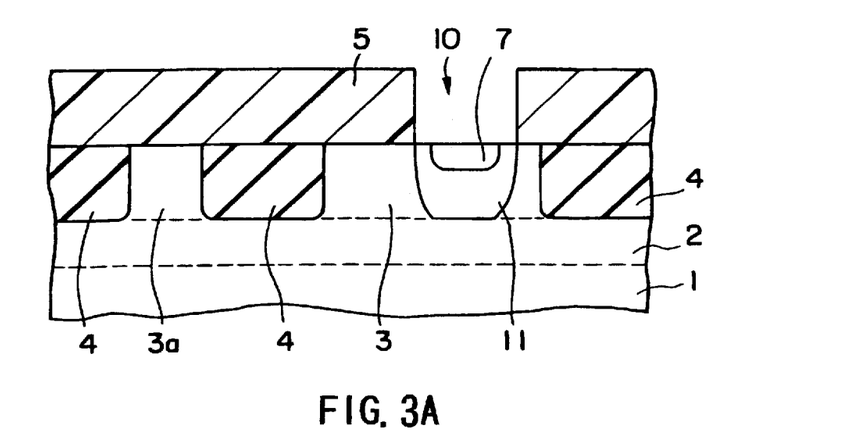

Further, as shown in FIG. 3A, the inner periphery of the hole 6 of the resist pattern 5 is etched by oxygen plasma, to widen the aperture width of the hole by about 0.05 to 0.15 μm, that is, to form an opening portion 10. Successively, the n-type impurity ions (e.g., P) are implanted with the resist pattern as a mask, to form the base region 11 with a predetermined concentration so as to reach the n-type buried layer 2.

Figure 3B:
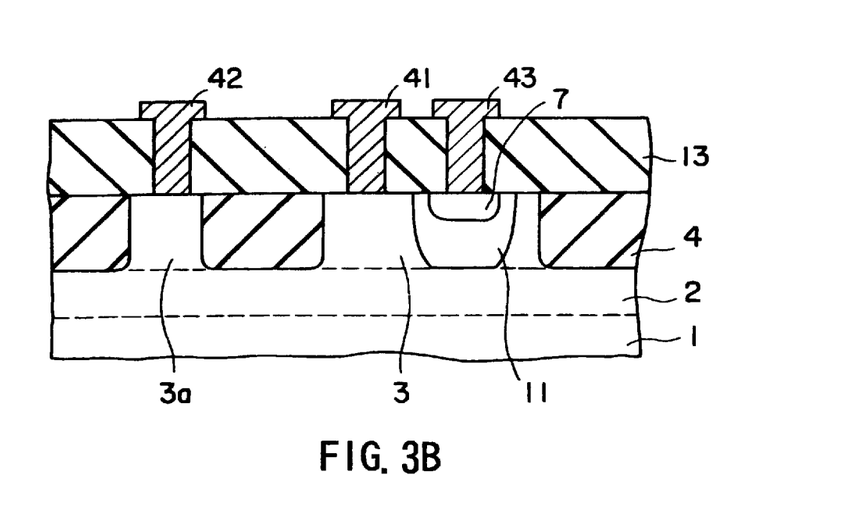

Further, as shown in FIG. 3B, after the resist pattern has been removed, the interlayer insulating film 13 formed of $SiO_2$, for instance is deposited all over the substrate 1 by use of CVD (Chemical Vapor Deposition) method. Further, the contact holes contacting with the collector region 3, the base leading region 3a and the emitter region 7, respectively are formed in the interlayer insulating film 13 by the photolithography and anisotropic etching. Further, the formed contact holes are buried by a metal film, and then patterned to form the collector electrode 41, the base electrode 42 and the emitter electrode 43, respectively.

As described above, in the semiconductor device according to the present invention, since the base width can be reduced markedly by controlling the aperture width of the hole 6, it is possible to operate the formed device at a high speed. In addition, since the base region 11 can be formed in the collector region 3 and further since the emitter region 7 can be formed in the base region 11, the proportion of the minority carriers injected from the lower surface of the emitter region 7 to the collector region 3 can be increased, so that it is possible to increase the current gain thereof.

In addition, since the impurity concentration of the emitter region 7 and that of the collector region 3 can be both changed, the breakdown voltage between the emitter and the collector can be increased, so that it is possible to increase the reliability of the element. Further, since the base region 11 can be formed by the ion implantation, it is possible to uniformalize the impurity concentration of the base in the direction from the emitter to the collector. In addition, since the number of the photolithography process can be reduced, as compared with that of the prior art manufacturing method, it is possible to reduce the manufacturing cost of the semiconductor device.

Further, in the above-mentioned embodiment, although the semiconductor device having a lateral pnp bipolar transistor has been explained, it is of course possible to obtain the same effect as above, when the semiconductor device has a lateral npn bipolar transistor.

(Third embodiment)

The third embodiment of the semiconductor device according to the present invention will be described with reference to FIG. 6. In this embodiment, the semiconductor device is a Bi-CMOS transistor, in which a lateral bipolar transistor and a CMOS transistor are both formed on the same semiconductor substrate 51.

Figure 6:
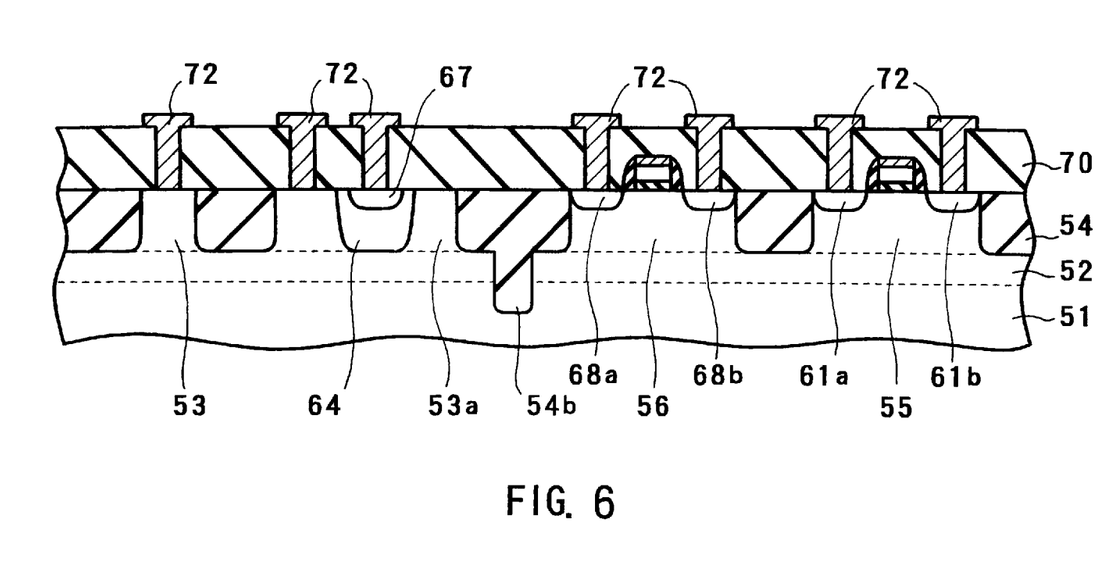
FIG. 6 is a cross-sectional view showing a third embodiment of the semiconductor device according to the present invention.

As shown in FIG. 6, an n-type buried layer 52 is formed in the surface region of a silicon substrate 51, and a p-type collector region 53a is formed at a predetermined region on the buried layer 52. Further, an n-type base leading region 53 is formed at another region on the buried layer 52. The base leading region 53 is insulated electrically from the collector region 53a by an element separation insulating film 54. Further, an n-type base region 64 is formed in horizontal contact with the collector region 53a and in vertical contact with the buried layer 52. Further, a p-type emitter region 67 is formed in the surface of the base region 64.

On the other hand, a p well 55 and an n well 56 are formed at a predetermined region on the buried layer 52, at which a CMOS transistor is to be formed. The p well 55 and the n well 56 are insulated electrically from each other by the element separation insulating film 54. In the same way, the n well 56 and the collector region 53a are insulated electrically from each other by the element separation insulating film 54b. A gate electrode is formed on the p well 55. An n type source region 61a and a drain region 61b are formed in the surface of the p well 55 so as to sandwich the gate electrode. In the same way, a gate electrode is formed on the n well 56. A p type source region 68a and a drain region 68b are formed in the surface of the n well 56 so as to sandwich the gate electrode.

Further, an interlayer insulating film 70 is formed on the semiconductor substrate 51 on which the above-mentioned semiconductor regions are formed. Further, the contact holes contacting with the collector region 53a, the base leading region 53, the emitter region 67, the source regions 61a and 68a, and the drain regions 61b and 68b are all formed in the interlayer insulating film 70. The formed contact holes are buried by a metal film, and then patterned to form various electrodes 72.

In the semiconductor device constructed as described above, since the base width of the bipolar portion can be reduced, it is possible to operate the formed device at a high speed. In addition, since almost all of the minority carriers emitted from the emitter region 67 can reach the collector region 53a, it is possible to increase the current gain thereof. In addition, since the impurity concentrations at the emitter region 67 and the collector region 53a can be adjusted, it is possible to improve the breakdown voltage between the emitter and collector regions.

(Fourth embodiment)

The fourth embodiment of the method of manufacturing the semiconductor device according to the present invention will be described with reference to FIGS. 7A to 7C and FIGS. 8A and 8B.

Figure 7A:
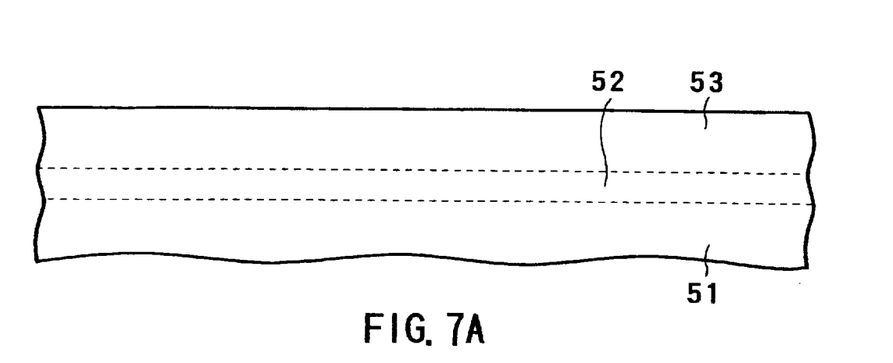
FIGS. 7A, 7B and 7C and FIGS. 8A and 8B are cross-sectional views showing the manufacturing process of a fourth embodiment of the method of manufacturing the semiconductor device according to the present invention.

First, as shown in FIG. 7A, after the n-type buried layer 52 of high concentration has been formed in the surface region of the silicon substrate 51, the n-type epitaxial layer 53 is grown on the silicon substrate 51.

Figure 7B:
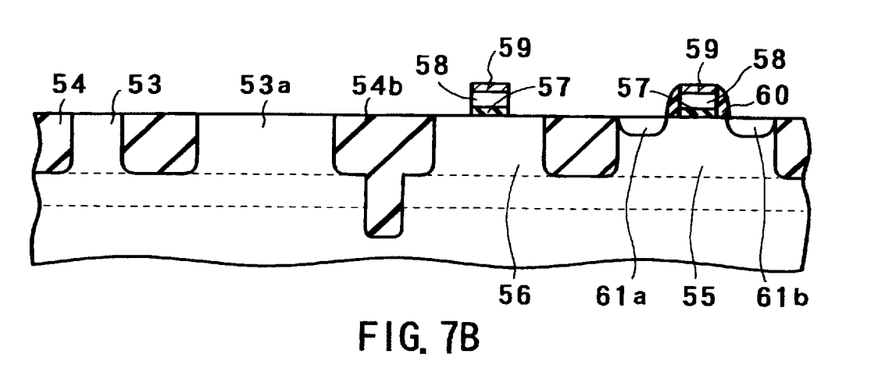

Further, as shown in FIG. 7B, after the n-type epitaxial layer 53 has been patterned to remove the epitaxial layer 53 from regions where the element separating regions are to be formed, an insulating film 54, 54b formed of $SiO_2$, for instance is buried at the regions from which the epitaxial layer has been removed. Successively, p-type impurity ions (e.g., B or $BF_2$) are implanted at the regions where the collector region of the bipolar portion and the well region of an nMOS transistor are to be formed, to form the collector region 53a and the p well 55 of the nMOS transistor.

Further, impurity ions are implanted in the p well 55 and the n well 56, to form a channel region, respectively. Successively, a gate oxide film 57, a poly crystal silicon film 58, and a metal silicide film 59 are formed in sequence all over the surface of a predetermined CMOS forming region, and then patterned to form the gate electrodes. Further, after a side wall 60 formed of $SiO_2$, for instance has been formed at the side portion of the gate electrode of the nMOS transistor, n-type impurity ions are implanted to form the source region 61a and the drain region 61b of the nMOS transistor.

Figure 7C:
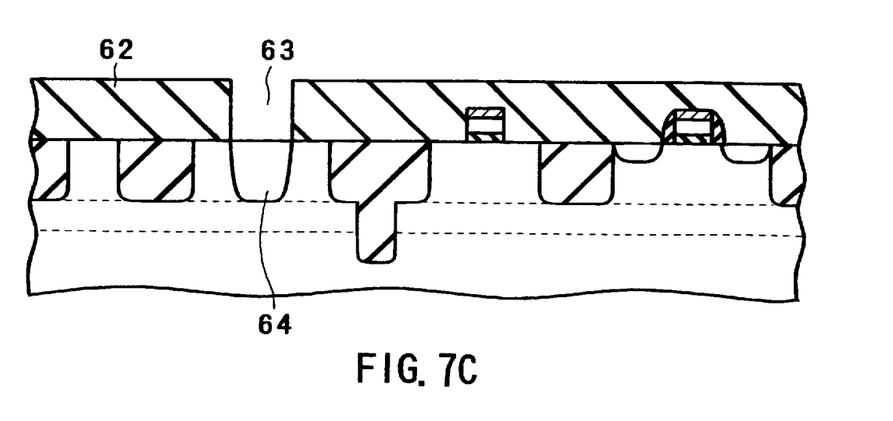

Further, as shown in FIG. 7C, after an insulating film 62 formed of $SiO_2$, for instance has been deposited all over the substrate, metal electrodes are formed to open a hole 63 at the collector region 53a of the bipolar portion. Successively, n-type impurity ions (e.g., As) are implanted to form the base region 64.

Figure 8A:
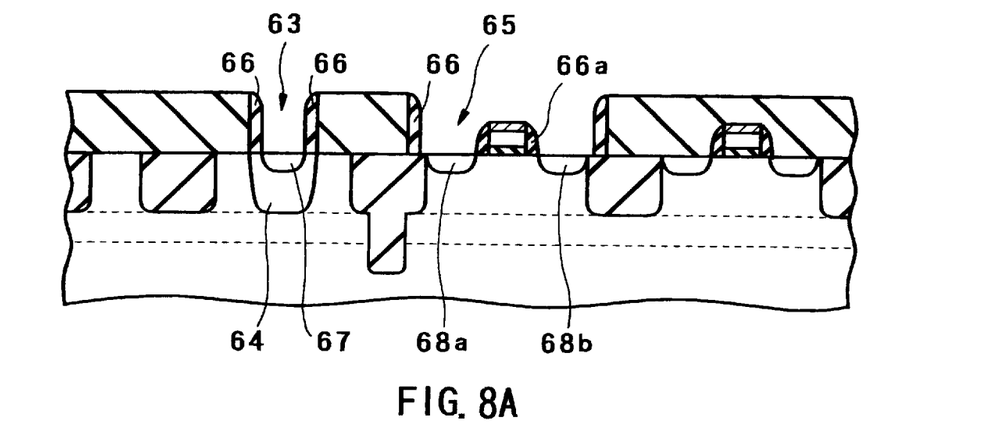

Further, as shown in FIG. 8A, after the insulating film 62 has been further patterned to open a hole 65, so as to expose a predetermined region where the pMOS transistor is to be formed, an insulating film formed of silicon nitride, for instance is formed all over the substrate. Successively, the formed silicon nitride film is etched by anisotropic etching method, to form two side walls 66 of silicon nitride on the side surfaces of the holes 63 and 65 and additionally a side wall 66a of silicon nitride on the side surface of the gate electrode of the pMOS transistor. Further, p-type impurity ions are implanted with these side walls 66 and 66a as masks, to form the emitter region 67 of the bipolar transistor, and the source region 68a and the drain region 68b of the pMOS transistor.

Figure 8B:
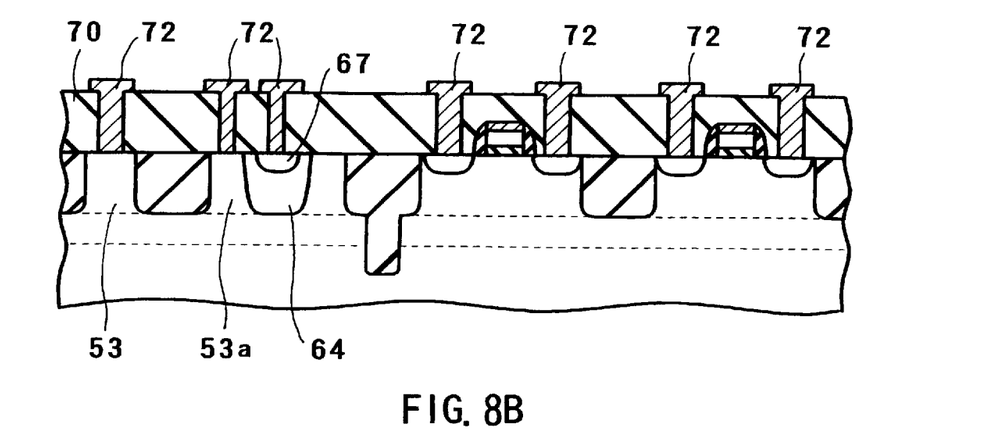

Further, as shown in FIG. 8B, an insulating film formed of $SiO_2$, for instance is deposited all over the substrate, to form an interlayer insulating film 70. Further, the contact holes are formed in the interlayer insulating film 70 by use of the photolithography and anisotropic etching. The formed contact holes are buried by a metal film and then patterned to form the various electrodes 72.

In the method of manufacturing the semiconductor device, since the aperture width of the hole 63 can be controlled by forming the side wall 66, it is possible to reduce the base width markedly, so that the high speed operation is enabled. Further, since the base region 64 is formed in the collector region 53a and additionally since the emitter region 67 is formed in the base region 64, the proportion of the minority carriers injected from the lower surface of the emitter region 67 to the collector region 53a can be increased, so that it is possible to increase the current gain thereof. In addition, since the impurity concentration at the emitter region 67 and that at the collector region 53a can be both changed, the breakdown voltage between the emitter and the collector can be increased, so that it is possible to increase the reliability of the element. Further, since the base region 64 can be formed by the ion implantation, it is possible to uniformalize the impurity concentration of the base in the direction from the emitter to the collector.

Further, in the above-mentioned embodiment, although the semiconductor device having a lateral pnp bipolar transistor has been explained, it is of course possible to obtain the same effect as above, when the semiconductor device has a lateral npn bipolar transistor.

Further, in the above-mentioned embodiment, although the n-type epitaxial layer 53 is grown on the n-type well buried layer 52, instead even if the p-type epitaxial layer is grown in the same way as with the case of the second embodiment, it is of course possible to manufacture the semiconductor device having the lateral bipolar transistor.

(Fifth embodiment)

The fifth embodiment of the method of manufacturing the semiconductor device according to the present invention will be described with reference to FIGS. 9A to 9D, FIGS. 10A to 10C, FIGS. 11A to 11C, FIGS. 12A to 12C, and FIGS. 13A and 13B. In this embodiment, a vertical and lateral bipolar transistors are both formed on the same substrate.

Figure 9A:
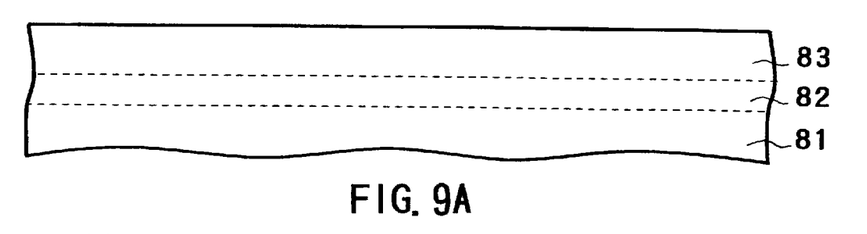
FIGS. 9A to 9D, FIGS. 10A to 10C, FIGS. 11A to 11C, FIGS. 12A to 12C, and FIGS. 13A and 13B are cross-sectional views showing the manufacturing process of a fifth embodiment of the method of manufacturing the semiconductor device according to the present invention.

First, as shown in FIG. 9A, after an n-type buried layer 82 of high concentration has been formed in the surface region of a silicon substrate 81, an n-type epitaxial layer 83 is grown on the silicon substrate 81.

Figure 9B:
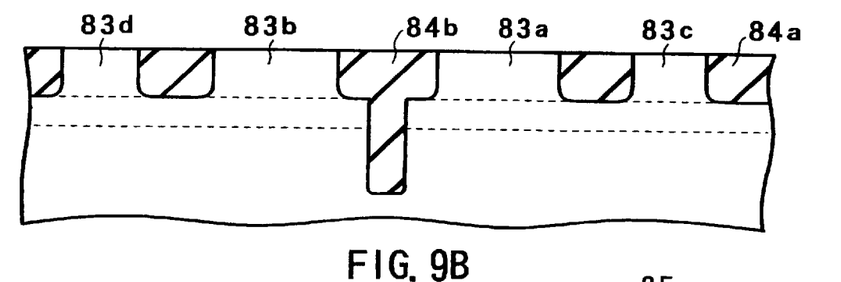

Further, as shown in FIG. 9B, after the n-type epitaxial layer 83 has been patterned to remove the epitaxial layer 83 from regions at which the element separating regions are to be formed, an insulating film formed of $SiO_2$, for instance is buried at the regions from which the epitaxial layer has been removed, to form element separating regions 84a and 84b. Therefore, the epitaxial layer 83 is separated into semiconductor layers 83a, 83b, 83c and 83d, respectively by the formed element separating regions 84a and 84b. Further, a vertical bipolar transistor and a lateral bipolar transistor are electrically separated from each other by the element separation insulating film 84b.

Figure 9C:
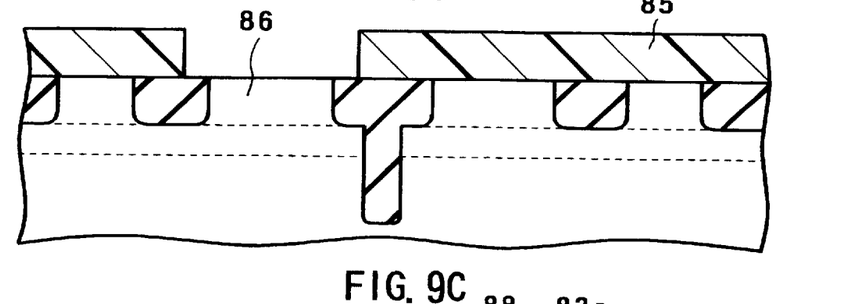

Successively, as shown in FIG. 9C, after a photoresist has been applied all over the substrate, the formed photoresist is patterned to form a resist pattern 85. In this resist pattern 85, only a predetermined region where a collector of the lateral bipolar transistor is to be formed is exposed. Further, p-type impurity ions are implanted with the resist pattern as a mask, to change the collector forming region 83b of the lateral bipolar transistor into an n-type semiconductor layer (a collector region) 86.

Figure 9D:
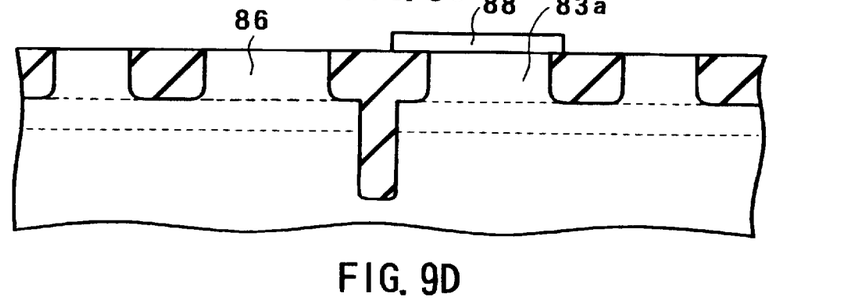

Further, as shown in FIG. 9D, after the above resist pattern 85 has been removed, a poly crystal silicon film is deposited all over the substrate and then patterned, to leave a poly crystal silicon film 88 only on the semiconductor layer 83a.

Figure 10A:
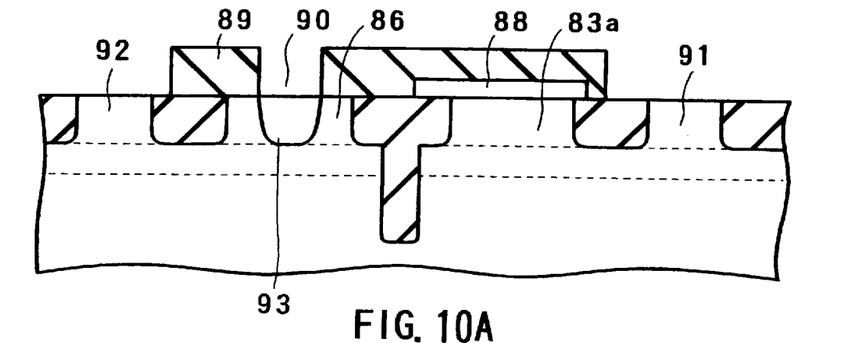

Further, as shown in FIG. 10A, an insulating film formed of $SiO_2$, for instance is deposited all over the substrate and then patterned, to expose a semiconductor layer 83c used as a collector leading region of the vertical bipolar transistor, a semiconductor layer 83d used as a base leading region of the lateral bipolar transistor, and a hole 90 for forming a base region of the lateral bipolar transistor. After that, n-type impurity ions are implanted, to form a high concentration collector leading region 91 of the vertical bipolar transistor and a high concentration base leading region 92 of the lateral bipolar transistor, and a base region 93 of the lateral bipolar transistor.

Figure 10B:
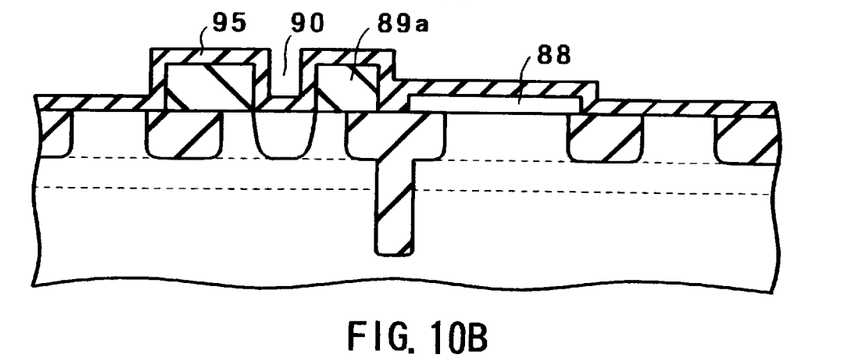

Further, as shown in FIG. 10B, an insulating film 95 formed of silicon nitride, for instance is deposited all over the substrate.

Figure 10C:
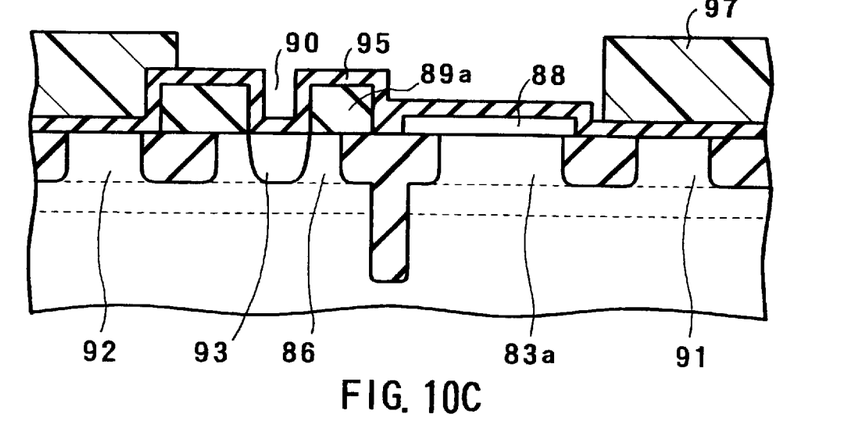

Further, as shown in FIG. 10C, after a photoresist is applied all over the substrate and then patterned, to form a resist pattern 97 for covering the collector leading region 91 of the vertical bipolar transistor and the base leading region 92 of the lateral bipolar transistor.

Figure 11A:
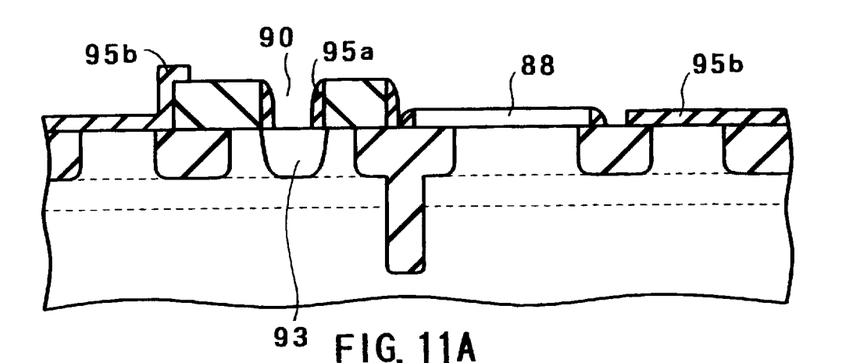

Further, as shown in FIG. 11A, the silicon nitride film 95 is etched by the anisotropic etching method with the formed resist pattern 97 as a mask, to leave the silicon nitride film 95a on the side surface of the hole 90 in such a way that the base region 93 can be exposed at the bottom of the hole 90 and further to expose the surface of the poly crystal silicon film 88.

Figure 11B:
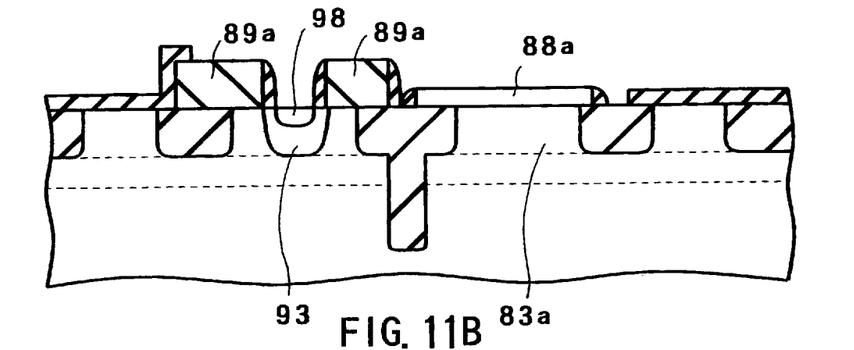

Further, as shown in FIG. 11B, after the resist pattern 97 has been removed, p-type impurity ions are implanted, to form an emitter region 98 of the lateral bipolar transistor and further to change the poly crystal silicon film 88 to a base leading electrode 88a.

Figure 11C:
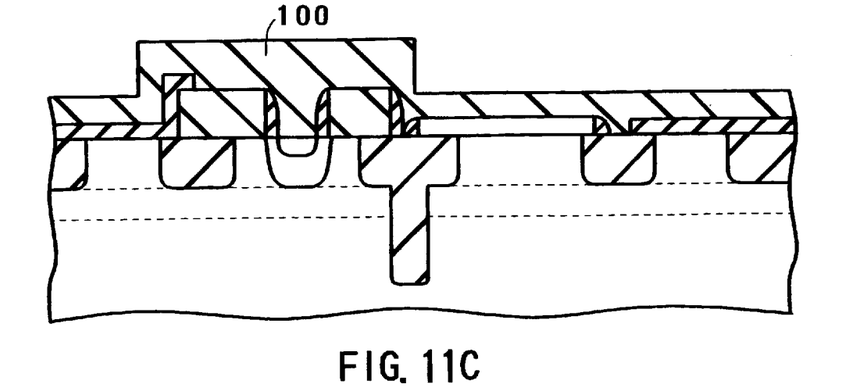

Further, as shown in FIG. 11C, an insulating film 100 formed of $SiO_2$, for instance is formed all over the surface of the substrate.

Figure 12A:
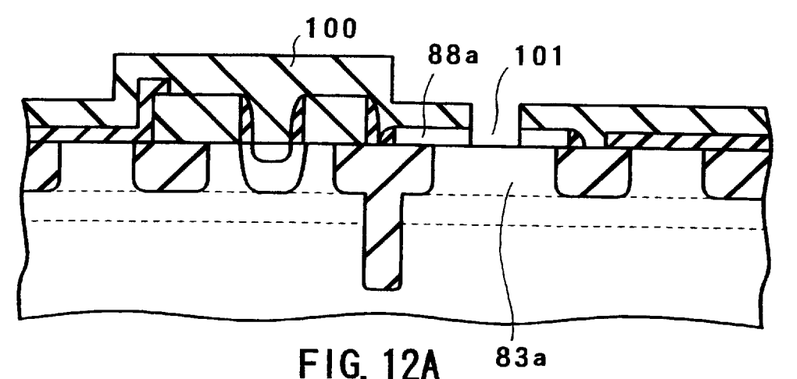

Successively, as shown in FIG. 12A, the insulating film 100 and the base leading electrode 88a are patterned, to open a hole 101 for forming the emitter and base of the vertical bipolar transistor.

Figure 12B:
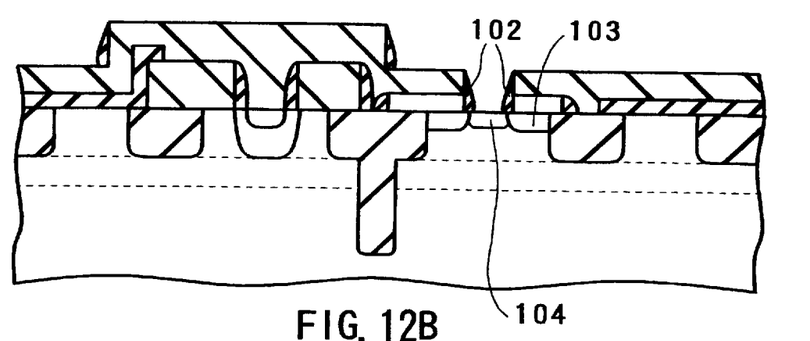

Further, as shown in FIG. 12B, an insulating film formed of silicon nitride, for instance is deposited all over the substrate, and then patterned by the anisotropic etching, to form a side wall 102 of the insulating film on the side wall of the hole 101. After that, the p-type impurities are diffused from the base leading electrode 88a to the epitaxial layer 83a by thermal process, to form an external base region 103. Successively, p-type impurity ions are implanted, to form an internal base region 104 of the vertical bipolar transistor.

Figure 12C:
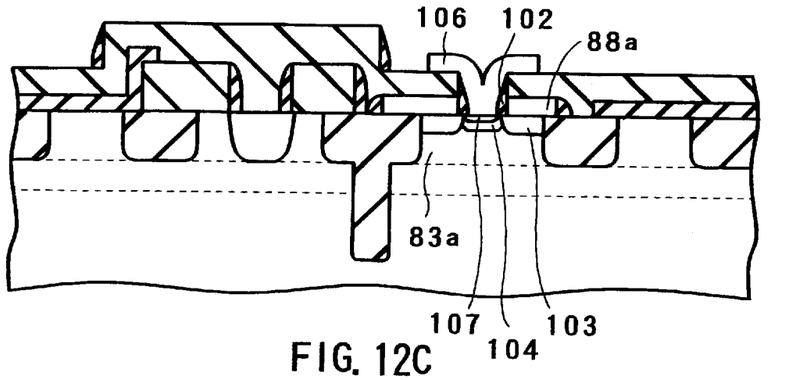

Successively, as shown in FIG. 12C, a poly crystal silicon film is deposited all over the substrate to bury the hole 101. Further, n-type impurity ions are implanted in the poly crystal silicon film. Further, the poly crystal silicon film is patterned to form an emitter leading electrode 106. After that, the n-type impurities are diffused from the emitter leading electrode 106 to the internal base region 104 by thermal process, to form an emitter region 107.

Figure 13A:
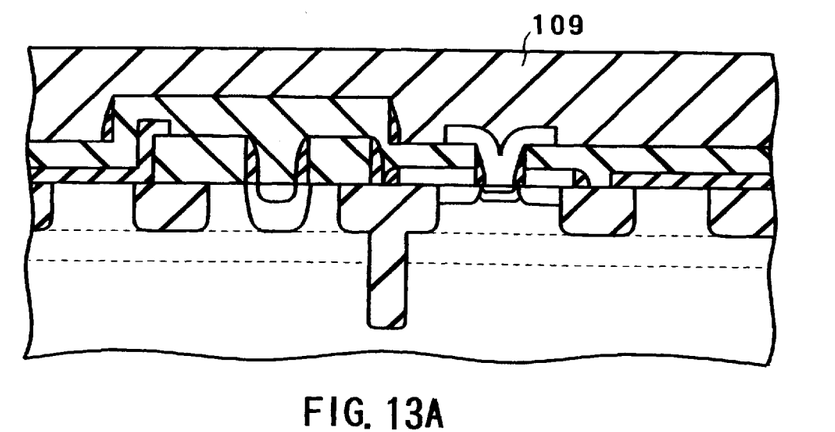

Further, as shown in FIG. 13A, an insulating film 109 formed of $SiO_2$, for instance is formed all over the surface of the substrate.

Figure 13B:
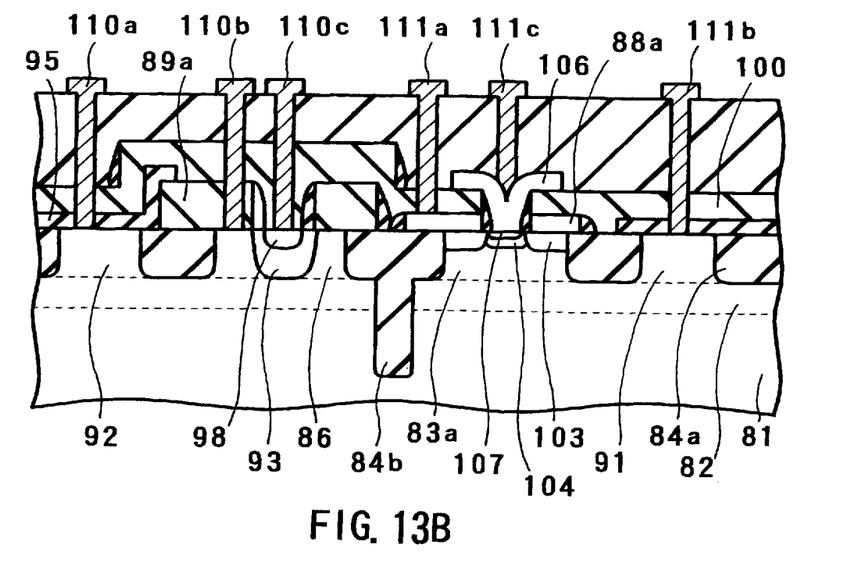

Further, as shown in FIG. 13B, contact holes are formed, and then these formed contact holes are buried by a metal film. The formed metal film is patterned to form a base electrode 110a, a collector electrode 110b and an emitter electrode 110c of the lateral bipolar transistor, and further a base electrode 111a, a collector electrode 111b and an emitter electrode 111c of the vertical bipolar transistor, respectively.

In this embodiment of the method of manufacturing the semiconductor device, the operation speed and the current gain can be both increased as high as possible, in the same way as with the case of the fourth embodiment. Further, since it is possible to change the impurity concentration between the emitter region 98 and the collector region 86, it is possible to increase the breakdown voltage between the emitter and collector.

Further, in the fourth and fifth embodiments, since the process of photolithography can be reduced, as compared with the case of the conventional method, it is possible to reduce the manufacturing cost of the semiconductor device.

Further, when the side wall is formed on the side surface of the hole, it is preferable to deposit the insulating film by LPCVD (Low Pressure Chemical Vapor Deposition) method. This is because the LPCVD method is excellent in the controllability of the film thickness of the side wall, as compared with the case of the normal pressure CVD method, with the result that it is possible to obtain a side wall of a precise film thickness even when a hole of a high aspect ratio is to be formed.

Further, in the fifth embodiment, when the poly crystal silicon film 88 is formed (as shown in FIG. 9D), it is possible to form this film 88 by depositing a poly crystal silicon film containing p-type impurities and by patterning the deposited film. In this case, in the process as shown in FIG. 10C, it is preferable to form the resist pattern 97 so as to cover the poly crystal silicon film 88.

As described above, in the method of manufacturing the semiconductor device according to the present invention, it is possible to enable high speed operation, to increase the current gain as high as possible, and further to decrease the manufacturing cost thereof. In addition, the breakdown voltage between the emitter and collector can be increased, with the result that the element reliability can be improved.

What is claimed is:

1. A method of manufacturing a semiconductor device, comprising the steps of:
    forming a first semiconductor layer with a first-conductivity type in a semiconductor substrate;
    forming a second semiconductor layer with a second-conductivity type different from the first-conductivity type on the first semiconductor layer;
    separating the formed second semiconductor layer into a first semiconductor region and a second semiconductor region by a first insulating film in the formed second semiconductor layer;
    changing the second semiconductor region to the first-conductivity type;
    forming a pattern of a second insulating film or a photo-resist film having a hole at a partial area of the first semiconductor region of the semiconductor substrate; and
    implanting first-conductivity type impurities and second-conductivity type impurities at the first semiconductor region, respectively by use of the formed pattern as a mask, to form a first-conductivity type impurity region contacting with the first semiconductor layer and a second-conductivity type impurity region in the first semiconductor region.

2. The method of manufacturing a semiconductor device of claim 1, wherein the step of forming the first-conductivity type impurity region and the second-conductivity type impurity region comprises the steps of:
    implanting one-conductivity type impurities;
    varying an aperture width of the patterned hole; and
    implanting the other-conductivity type impurities by use of the pattern in which the aperture width of the hole has been varied as a mask.

3. The method of manufacturing a semiconductor device of claim 2, wherein:
    one-conductivity type is the first-conductivity type;
    the step of varying the aperture width of the patterned hole is a step of forming a side wall film on a side wall portion of the hole; and
    the implantation of the other-conductivity type is to implant the second conductivity type impurities by use of the side wall film and the pattern as a mask.

4. The method of manufacturing a semiconductor device of claim 2, wherein:
    one-conductivity type is the second conductivity type;
    the step of varying the aperture width of the patterned hole is a step of etching the hole to widen the aperture width thereof; and
    the implantation of the other-conductivity type is to implant the first-conductivity type impurities by use of the pattern in which the aperture width has been widened as a mask.

5. The method of manufacturing a semiconductor device of claim 1, wherein the first semiconductor region is a collector region; the first-conductivity type impurity region is a base region; and the second-conductivity type impurity region is an emitter region.

6. A method of manufacturing a semiconductor device, comprising the steps of:
    forming a first semiconductor layer with a first-conductivity type in a semiconductor substrate;
    forming a second semiconductor layer with the first-conductivity type on the first semiconductor layer;
    separating the formed second semiconductor layer into a first semiconductor region and a second semiconductor region by a first insulating film in the formed second semiconductor layer;
    changing the first semiconductor region to a second-conductivity type different from the first conductivity type;
    forming a pattern of a second insulating film or a photo-resist film having a hole in a partial area of the first semiconductor region on the semiconductor substrate; and
    implanting first-conductivity type impurities and second-conductivity type impurities at the first semiconductor region, respectively by use of the formed pattern as a mask, to form a first-conductivity type impurity region contacting with the first semiconductor layer and a second-conductivity type impurity region in the first semiconductor region.

7. The method of manufacturing a semiconductor device of claim 6, wherein the step of forming the first-conductivity type impurity region and the second-conductivity type impurity region comprises the steps of:
    implanting one-conductivity type impurities;
    varying an aperture width of the patterned hole; and
    implanting the other-conductivity type impurities by use of the pattern in which the aperture width of the hole has been varied as a mask.

8. The method of manufacturing a semiconductor device of claim 7, wherein:
    one-conductivity type is the first-conductivity type;
    the step of varying the aperture width of the patterned hole is a step of forming a side wall film on a side wall portion of the hole; and
    the implantation of the other-conductivity type is to implant the second-conductivity type impurities by use of the side wall film and the pattern as a mask.

9. The method of manufacturing a semiconductor device of claim 7, wherein:

one-conductivity type is the second-conductivity type;

the step of varying the aperture width of the patterned hole is a step of etching the hole to widen the aperture width thereof; and the implantation of the other-conductivity type is to implant the first-conductivity type impurities by use of the pattern in which the aperture width has been widened as a mask.

10. The method of manufacturing a semiconductor device of claim 6, wherein the first semiconductor region is a collector region; the first-conductivity type impurity region is a base region; and the second-conductivity type impurity region is an emitter region.

11. A method of manufacturing a semiconductor device, comprising the steps of:

forming a first semiconductor layer with a first-conductivity type in a semiconductor substrate;

forming a second semiconductor layer with the first-conductivity type on the first semiconductor layer;

separating the formed second semiconductor layer into first to second semiconductor regions by a first insulating film in the formed second semiconductor region;

changing the first semiconductor region to a second-conductivity type different from the first-conductivity type;

forming a gate electrode on the second semiconductor region;

forming a pattern of a second insulating film having a first hole in a partial area of the first semiconductor region of the semiconductor substrate;

implanting first-conductivity type impurities at the first semiconductor region by use of the formed pattern as a mask, to form a first first-conductivity type impurity region contacting with the first semiconductor layer;

forming a second hole in the pattern to expose the second semiconductor region;

forming a side wall film on a side wall portion of the first hole; and implanting second-conductivity type impurities by use of the pattern as a mask, to form a second second-conductivity type impurity region in a surface of the first impurity region and a third second-conductivity type impurity region in a surface of the second semiconductor region, respectively.

12. The method of manufacturing a semiconductor device of claim 11, wherein when the side wall film is formed in the first hole, a side wall film is also formed on a side wall portion of the gate electrode.

13. The method of manufacturing a semiconductor device of claim 11, wherein the first semiconductor region is a collector region; the first impurity region is a base region; the second impurity region is an emitter region; and the third impurity region is a source-drain region.

14. A method of manufacturing a semiconductor device, comprising the steps of:

forming a first semiconductor layer with a first-conductivity type in a semiconductor substrate;

forming a second semiconductor layer with the first-conductivity type on the first semiconductor layer;

separating the formed second semiconductor layer into first to fourth semiconductor regions by a first insulating film in the second semiconductor layer;

changing the first semiconductor region to the second-conductivity type different from the first-conductivity type;

forming a poly crystal silicon film for covering the second semiconductor region;

forming a pattern of an insulating film having a hole in a partial area of the first conductor region;

implanting first-conductivity type impurities at the first semiconductor region by use of the formed pattern as a mask, to form a first first-conductivity type impurity region contacting with the first semiconductor layer;

depositing a second insulating film all over the substrate and further etching the substrate anisotropically, to form a side wall film on a side wall portion of the hole; and implanting second-conductivity type impurities in a surface of the first impurity region, to form a second second-conductivity type impurity region.

15. The method of manufacturing a semiconductor device of claim 14, wherein when the poly crystal silicon film is being formed, the second-conductivity type impurities are implanted in the poly crystal silicon film.

16. The method of manufacturing a semiconductor device of claim 14, wherein when the side wall film is being formed, a surface of the poly crystal silicon film is exposed by the anisotropic etching; and when the second impurity region is being formed, the poly crystal silicon film is changed to a second-conductivity type semiconductor film.

17. The method of manufacturing a semiconductor device of claim 14, wherein the pattern is formed with holes for exposing the second and fourth semiconductor regions; and when the first impurity region is being formed, the first-conductivity type impurities are implanted in the second and fourth semiconductor regions to increase an impurity concentrations thereat.

18. The method of manufacturing a semiconductor device of claim 14, wherein the first semiconductor region, the first impurity region, and the second impurity region are a collector region, a base region, and an emitter region of a lateral bipolar transistor, respectively; and the second semiconductor region is a base leading region of the lateral bipolar transistor; and the fourth semiconductor region and the poly crystal silicon film are a collector leading region and a base leading electrode of a vertical bipolar transistor, respectively.

* * * * *